United States Patent [19]

Jakiela et al.

[11] Patent Number: 5,155,895
[45] Date of Patent: Oct. 20, 1992

[54] METHOD AND APPARATUS FOR AUTOMATIC PARTS ASSEMBLY

[75] Inventors: Mark J. Jakiela, Cambridge; Paul Moncevicz, Arlington; Karl T. Ulrich, Belmont, all of Mass.

[73] Assignee: Massachusetts Institute of Technology, Cambridge, Mass.

[21] Appl. No.: 582,402

[22] Filed: Sep. 13, 1990

[51] Int. Cl.$^5$ .............................................. B23P 11/02
[52] U.S. Cl. ........................................ 29/453; 29/525; 29/821
[58] Field of Search ........................... 29/453, 525, 821

[56] References Cited

U.S. PATENT DOCUMENTS

| | | | |
|---|---|---|---|
| 3,508,314 | 4/1970 | Powell | 29/821 X |
| 3,518,752 | 7/1970 | Lentz | 29/821 X |
| 3,667,103 | 6/1972 | Petree | 29/821 X |
| 3,704,504 | 12/1972 | Koegler | 29/821 |
| 4,127,924 | 12/1978 | Ross | 29/453 X |
| 4,194,668 | 3/1980 | Akgurek | 29/821 X |
| 4,330,923 | 5/1982 | Cummings | 29/453 X |
| 4,341,006 | 7/1982 | Staron | 29/453 X |
| 4,360,969 | 11/1982 | Collier | 29/453 X |

OTHER PUBLICATIONS

Assembly Automation Aug. 1988 "Advanced Parts Orientation System has Wide Application" Hajime Hitakawa, pp. 147 to 150.
Assembly Automation, Feb. 1988, pp. 49 to 51.
Convum International Corp., Business Week/Jun. 4, 1990, p. 136.

Primary Examiner—Timothy V. Eley
Assistant Examiner—C. Richard Martin
Attorney, Agent, or Firm—Wolf, Greenfield & Sacks

[57] ABSTRACT

A method and apparatus for automatic orientation and assembly are provided. A first plurality of parts are mated with corresponding depressions or other irregularities formed in a pallet by vibrating the pallet and moving the parts thereover. A second plurality of parts are then oriented in a predetermined positional relationship with the first parts, for example matingly engaged therewith, by passing the parts over the pallet which is again vibrated, generally with different vibration parameters. The second parts may matingly engage corresponding irregularities in the first part, may be positioned and oriented by further irregularities on the pallet, or a template may be provided over the pallet with openings for positioning and orienting the second parts. The passing of parts over the pallel and vibration of the pallet may be repeated for additional parts to be assembled if desired. Matingly engaged parts may be secured together by applying pressure, preferably en masse, to at least one part of each part pair or by other suitable means.

17 Claims, 2 Drawing Sheets

METHOD AND APPARATUS FOR AUTOMATIC PARTS ASSEMBLY

FIELD OF THE INVENTION

This invention relates to the field of automated manufacturing and more particularly to a method and apparatus for automatically assembling two or more parts.

BACKGROUND OF THE INVENTION

The cost of manufacturing mechanical, electrical and electromechanical products has been reduced over the years by the increasing use of industrial automation. However, when such techniques are utilized for assembling parts, they normally involve the use of robots or other relatively expensive and sophisticated equipment.

In particular, a recently developed technique used in industrial automation is the APOS parts presentation technology developed by Sony Corporation. This technology involves dumping a quantity of parts of a given type onto a specially designed pallet. The pallet has depressions machined into its surface that allow the parts to fit in the depressions only in a predetermined one or more orientations. As the pallet is vibrated, randomly-oriented parts eventually find their way into these depressions. When enough parts have been passed across the pallet, most of the depressions are filled and the pallet moves on to the next step in the assembly process. With the APOS technology, this step may be an assembly step which is performed by a robot which picks parts out of the pallet and performs the assembly operation.

While the APOS technology, and other existing industrial automation procedures, can result in substantial savings over performing the same assembly operations manually, further savings could be effected if expensive robotic or other sophisticated assembly equipment could be replaced with less expensive technology.

SUMMARY OF THE INVENTION

It is, therefore, a primary object of this invention to provide a lower cost method and apparatus for the presentation and assembly of parts in an automated manufacturing operation.

In accordance with the above, this invention provides a technique for automatically forming N assemblies of M parts each, and more particularly for automatically assembling a plurality of first parts with a corresponding plurality of second parts. For preferred embodiments of the invention, the first and second parts are mating parts. The technique involves dumping the first parts on a pallet having depressions or other irregularities formed therein which are sized and shaped to permit the first parts to mate therewith with a predetermined orientation. The pallet is then vibrated to cause the first parts to move into the depressions or to otherwise mate with the irregularities, the parts when mated in the irregularities having a predetermined orientation. The second parts are then dumped over the pallet having the first parts mated with at least most of the irregularities therein, and the pallet is again vibrated to move the second parts into a predetermined positional relationship, for example, mating engagement, with corresponding first parts. Irregularities or other control elements are provided to control the orientation and position of the second parts to achieve the desired positional relationship. Additional parts may be assembled by repeating the dumping and vibrating steps for such parts.

Once the parts are mated, the parts may be secured together in a suitable way. For example, where the mating first and second parts pressure-fit or snap-fit together, pressure may be applied to at least one of the first or second parts in mating engagement to secure the parts together. A similar procedure may be utilized to deform one of the parts to perform the securing operation.

For one embodiment of the invention, the second parts are merely dumped on the pallet and are oriented by mating depressions, projections or other irregularities on the pallet and/or parts. For a second embodiment, after the first parts are fitted in depressions/irregularities in the pallet, a template is laid over the pallet, which template has openings formed therethrough which are sized and shaped to receive and properly orient the second parts. The second parts are dumped on the template and the template is vibrated with the pallet. Template openings and/or pallet irregularities may be designed to permit parts to fit therein in only a single orientation or in a predetermined two or more orientations, depending on the degree of symmetry of the parts.

The foregoing and other objects, features and advantages of the invention will be apparent from the following more particular description of preferred embodiments of the invention as illustrated in the accompanying drawings.

IN THE DRAWINGS

DETAILED DESCRIPTION

Figure 1:
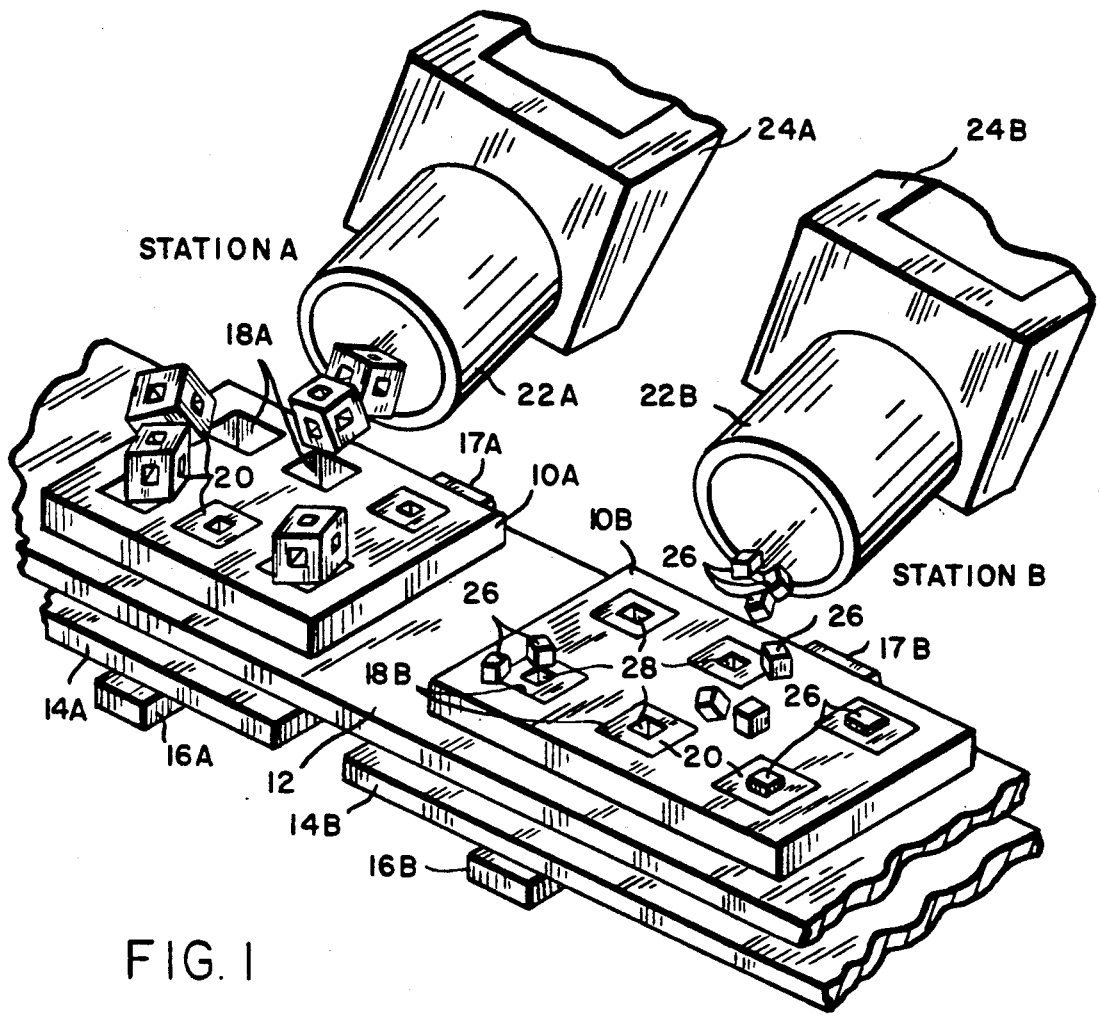
FIG. 1 is a perspective view of equipment being utilized to assemble parts in accordance with a first embodiment of the invention.

FIG. 1 illustrates a first embodiment of the invention wherein pallets 10 are mounted on a conveyor 12. Two separate stations, station A and station B, are shown in FIG. 1. Conveyor 12 rests on a vibration table (14A and 14B) at each station. The vibration tables are vibrated in three dimensions by suitable mechanisms 16A, 16B and 17A, 17B. Vibration tables 14 and the mechanisms 16, 17 for vibrating the tables could be of the same type utilized in the Sony APOS system. Generally, each mechanism 16, 17 is an electric motor which is connected through a slip mechanism to the bottom and side, respectively, of the table. By independently controlling the motor RPM's and the motor interconnects or other biasing mechanism for the tables, the vibration frequency, amplitude and/or pattern may be independently controlled for each table 14.

Each pallet 10 has a plurality of depressions 18 formed therein, which depressions are sized and shaped to receive a predetermined part 20 with the part 20 in a predetermined orientation. For purposes of illustration, the parts 20 are shown in FIG. 1 as being cube-shaped with a substantially cube-shaped depression 28 formed in each surface of a part 20. Therefore, the parts 20 can fit in the depressions 18 with an orientation permitting any one of the surfaces of cube 20 to be exposed. As will be discussed later, this is not the normal case, and various techniques for orienting a part in a particular way in a depression 18 will be discussed.

At a station A, a pallet 10A is adjacent a chute 22A extending from a parts hopper 24A. When a pallet 10A is brought adjacent to chute 22A, the hopper is opened to permit a selected number of parts 20 to pass through chute 22A to be dumped on pallet 10A. The number of such parts should be substantially greater than the number of depressions 18 in the pallet to enhance the likelihood of all depressions being filled by a part 20 during the vibration operation. While only six depressions 18 and seven pieces 20 are shown in FIG. 1, this is for purposes of illustration only, and in a practical system much larger numbers of both depressions and parts would be utilized. For example, pallets utilized in an APOS system typically have 10-20 depressions. The number of parts dumped on the pallet would typically be 2-3 times the number of depressions. Table 14A would typically be tilted at a slight angle, for example, between 2° and 10°, with 6° being typical, to facilitate movement of parts across the pallet in a desired direction. By selecting the orientation of the pallet relative to chute 22A and the direction and angle in which the pallet is tilted, a desired preferred direction of travel for parts 20 across the pallet can be established and controlled.

When parts 20 have been dumped on pallet 10A, or, more typically, during the period that parts 20 are being dumped on pallet 10A, the pallet is vibrated in three dimensions with a predetermined frequency, amplitude and pattern by causing vibration table 14A to be vibrated by mechanisms 16A and 17A. The vibration intensity is sufficient to cause parts 20 to move about and to have their orientation shifted on pallet 10A so that the parts 20 eventually find their way into depressions 18A in a desired orientation. The vibration operation proceeds long enough so that most, if not all, of the depressions 18A in pallet 10A have a part 20 positioned therein when the vibration operation is complete. Excess parts on pallet 10A may move off the end of the pallet as a result of the vibration action and of the pallet angle. The excess parts are collected, and ultimately returned to hopper 24A for recycling during the vibration operation and/or thereafter.

What has been described to this point is a standard APOS system. The novelty of this system is that, once pallet 10A has been loaded at station A, it is advanced by conveyor 12 to station B and a new empty pallet 10A is moved to station A adjacent chute 22A. Thus, at the same time that parts 20 are being dumped on pallet 10A from chute 22A, parts 26 may be dumped from hopper 24B through chute 22B onto pallet 10B. Pallet 10B has all or most of its depressions 18 filled with parts 20. While, in the figure, all depressions in pallet 10B are shown as being filled with parts 20, this may not always be the case. Each part 20 has a depression 28 formed in its exposed upper surface, which depression is sized to permit a part 26 to fit therein with a predetermined orientation. Again, parts 26 are, for simplicity, shown as being cubes so that they may fit in the depressions 28 with any one of their surfaces exposed. However, as will be discussed in greater detail later, this also is not a limitation on the invention.

Either while parts 26 are being dumped on pallet 10B from chute 22B or after the parts 26 have been dumped on the pallet, the pallet is three-dimensionally vibrated by table 14B, causing the parts 26 to migrate into depressions 28 in the same way the parts 20 migrated into depressions 18. Since the optimum vibration parameters vary for different parts, one or more of the vibration frequency, amplitude and patterns would generally be different for station B from those for station A. These parameters may also vary if the stations are used for differing parts. Thus, assuming enough parts 26 are dumped on pallet 10B, and assuming that the vibration operation is performed for a sufficient period of time, all or substantially all of the depressions 28 should have a part 26 mounted therein when the vibration operation has been completed. Thus, the parts 20 and 26 can be assembled utilizing relatively inexpensive vibratory palletization equipment, rather than far more expensive robotic equipment.

While the simplified embodiment of the invention shown in FIG. 1 is operative to assembled two parts, it has some limitations. The first such limitation is that, as shown, the parts 26 are adapted to fit into the openings 28 in a variety of orientations, both the parts 26 and the openings 28 being substantially symmetrical. Where the orientation of the part becomes critical, various techniques known in the art and utilized to some extent with the APOS systems, can be utilized to assure proper orientation. These include key slots or other asymmetries to the part which assure that they can fit into a depression 28 in only a limited number of orientations. In some situations, only a single orientation may be acceptable.

Figure 2:
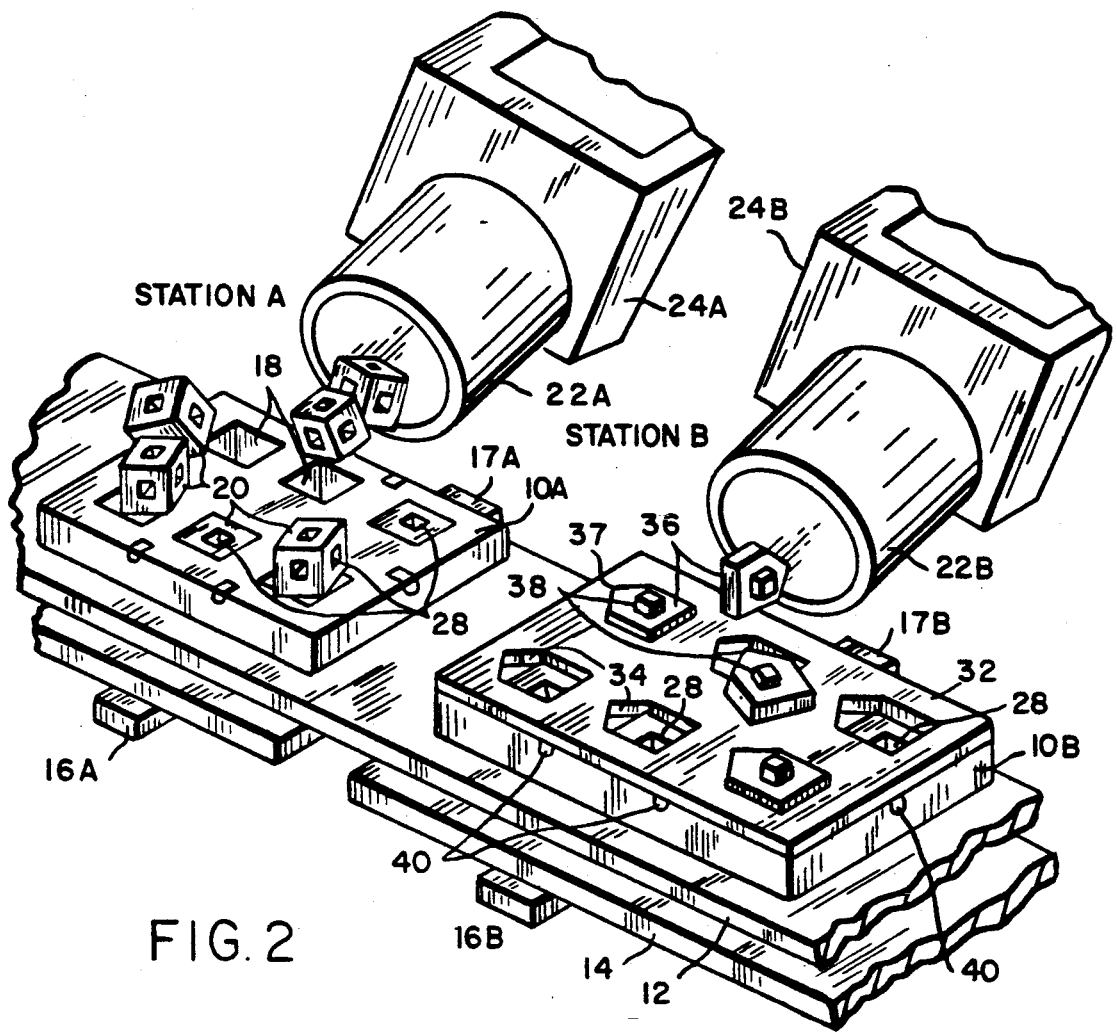
FIG. 2 is a perspective view of equipment being utilized to assemble parts in accordance with a second embodiment of the invention.

FIG. 2 shows another way in which the parts to be mated which are provided at station B may be properly oriented. In FIG. 2, parts 20 are loaded at station A in the same way as for the embodiment of the invention shown in FIG. 1. However, at station B, a template 32 is laid on pallet 10. The template has a plurality of openings 34 formed therethrough which are sized and shaped to receive a second part 36 to be assembled to the part 20 at station B with only two possible orientations. Thus, the pointed tip 37 of part 36 can fit into the opening 34 with the part oriented as shown in the figure, or with the part rotated 180° about the tip 37 so that the projection 38 which was on top is now on the bottom and vice-versa. The projection 38 facing downward fits into depression 28 in part 20, mating the parts 20 and 36. If it was desired to have only a single projection 38 on part 36, with the part 36 being properly oriented only when this projection is facing downward to mate with a depression 28, one of the angled sides of part 36 could be made longer than the other, the tip 37 thus being off center, so that the part 36 fits in an opening 34 in template 32 with only a single proper orientation.

The template 32 may be laid on pallet 10 when the pallet reaches station B or at any time prior thereto after the vibratory loading of parts 20 in the pallet has been completed. The template may be laid on pallet 10 either manually or a suitable piece of equipment may be provided for automatically performing this function. Preferably, this function is automatically performed utilizing a simple mechanism to lower the template into place. If desired, one or more registration projections 40 may be provided, either on template 32 as shown or on pallet 10, and mate with grooves on the other element to assure and maintain proper orientation between the pallet and template. As will be discussed later in conjunction with FIG. 4, a preferred form for the registration projection is a tapered pin in one element which mates with a corresponding opening in the other element. This permits small errors in registration between the pallet and template to be corrected. The pallet may be slightly vibrated to permit registration where the pins and holes do not initially mate. Proper registration between the pallet and template is important to assure that parts 20 and 36 are properly mated.

Figure 3:
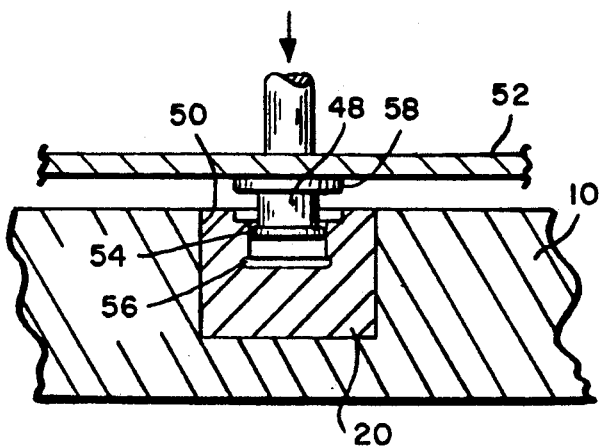
FIG. 3 is a cutaway side view of a single pair of mating parts prior to pressure being applied to snap-fit the parts together.

While parts may be mated by the procedures described so far, merely relying on gravity for the mating of parts may not result in the parts being permanently attached. This may make it more difficult to automatically remove the mated-part assembly from the pallet and to use the mated parts as a subassembly in a subsequent operation. FIG. 3 illustrates one way in which parts may be permanently or semipermanently mated. In this figure, the part 48 mates to the position shown in the figure, generally as a result of gravity, but is not fully mated with the part 20. For one embodiment of the invention, the part 48 is pressure-fit in the depression 50, a pressure plate 52 being applied to the top of part 48 at Station B after the assembly step, or at a station beyond station B, for example, a station C, to pressure-fit the two parts together. For the embodiment specifically indicated in FIG. 3, a snap ring 54 is provided at the bottom of part 48 which snaps into a corresponding groove 56 in the bottom of depression 50 when pressure is applied by pressure plate 52 to the top of part 48, thereby snap-fitting the two parts together. In order to assure that part 48 is oriented in depression 50 with the snap ring 54 at the bottom of part 48, a head 58 may be provided on the top of part 48 to prevent the part from fitting in groove 50 headfirst.

Figure 4:
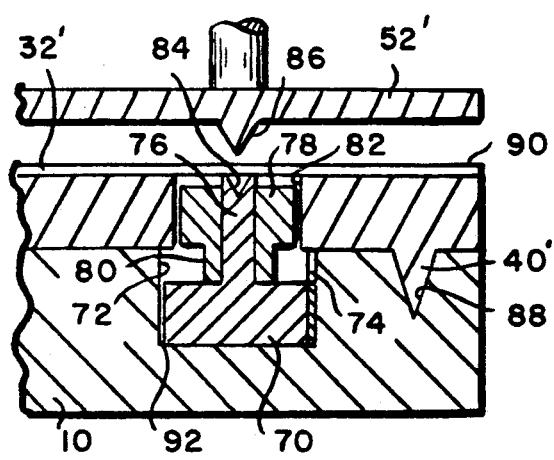
FIG. 4 is a cross-sectional view of a single pair of parts assembled using a template with pressure about to be applied to deform a portion of one part to secure the parts together.

FIG. 4 illustrates another technique which might be utilized for securing two parts together. In this figure, a part 70, for example, a gear, is initially mounted in a depression 72 in a pallet 10. A key-slot 74 may be provided on the depression to assure proper orientation of the part 70 and other suitable means may be provided to assure that the part is oriented in depression 72 as shown with shaft 76 projecting upward.

A second part 78, which may be a second gear with a spacer portion 80, fits on shaft 76 and is properly oriented by an opening 82 in template 32'. Shaft 76 has a slit 84 formed in its top surface. Pressure plate 52' has a pointed projection 86 extending from its lower surface which is adapted to fit in and expand slit 76 to secure parts 70 and 78 together.

FIG. 4 also illustrates three other features of the invention. First, a tapered registration pin 40' is shown which extends from template 32' and mates in a corresponding groove 88 in pallet 10. As previously indicated, two or more such pin and opening combinations would normally be utilized to effect registration between the template and the pallet, with the tapered shape of the pin permitting minor errors in registration when a template is automatically dropped on the pallet to be corrected. Larger errors may be corrected by vibrating the pallet.

Second, FIG. 4 shows a guide rail 90 which extends along the upper surface of the template parallel to the direction of movement of parts, such as part 78, which are to be oriented by the template. Rails 90, which are also used in the APOS system, would extend on either side of a row of openings and would be utilized to pre-orient parts having an aspect ratio so that the parts are more likely to be properly oriented when they arrive over an opening 34 in the template. Rails such as the rails 90 might also be utilized on a pallet 10 to perform the same pre-orienting function.

Finally, FIG. 4 shows some space or tolerance, such as the space 92, between the parts 70 and 78 and the depressions or openings in which they are positioned. It has been found that while in the APOS system, tolerances of several thousandths of an inch are frequently utilized, tolerances of several hundredths of an inch have, in some instances, been found to be preferable for this invention, such tolerances permitting slight movement of each of the parts in their depressions to facilitate the mating thereof. The shape of the depressions or openings do not have to exactly match the shape of the part so long as the shapes are sufficiently matched to assure proper positioning and orienting of the part. For irregularly shaped parts, this may result in significant cost savings.

Figure 5:
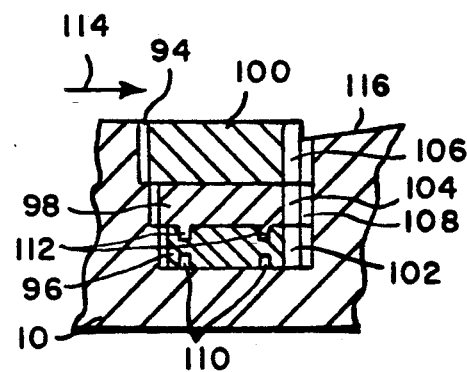
FIG. 5 is a cross-sectional view of a single assembly of three parts in a multilayer pallet.

FIG. 5 shows another embodiment of the invention which illustrates several additional features. First, this embodiment of the invention has a multi-level depression 94 formed in pallet 10. A first level of the depression is adapted to receive a part 96, a second level is adapted to receive a part 98, and the top level is adapted to receive a part 100. Each part has a key projection 102, 104 and 106, respectively, which mates in a key groove 108 extending the length of depression 94 to properly orient the three parts therein. Part 96 has depressions 110 formed therein which mate with pins 112 extending from the bottom of part 98. However, there is no mating between parts 98 and 100, these parts merely being assembled with a desired positional relationship for a future assembly operation. FIG. 5 also illustrates the tolerances between the parts and depression 94 to facilitate mating.

Finally, FIG. 5 illustrates a way in which the positioning of parts in a depression may be facilitated. Typically, because of the initial slope of pallet 10, parts would move along the pallet in the direction of arrow 114. However, if a part moves past depression 94 without being properly oriented to drop therein, it may get stopped at slope portion 116 and caused to move backward toward depression 94, giving the part a second chance to fit therein. A slope such as a slope 116 may also be utilized on template 32.

With any of the embodiments which have been described so far, once the parts are assembled, they are passed on to an assembly station where a suitable robot or other mechanism grasps the assembled parts to remove them from the pallet, and template if appropriate, and to move the subassembly to the next step in the operation. Where the parts have not been secured together, or where the parts are merely positionally oriented as for example the parts 98 and 100 in FIG. 5, the mechanism grabbing the parts to remove them from the pallet would be designed in known manner to hold the parts together as they are removed and moved to the next assembly step. While typically the template would not be removed from the pallet until after the parts are removed, it is also possible to remove the template prior to the removal of the parts to facilitate grasping the parts for removal from the pallet. Removal of the template, either before or after removal of the parts, can be accomplished with a simple vertical grasp grabbing mechanism. Removal of parts from the pallet may be accomplished either one assembly at a time or with a selected plurality up to all of the subassemblies being removed simultaneously.

While for the disclosed embodiments, only two or three parts are assembled "en masse" using the techniques of this invention, it is apparent that these techniques could be expanded by, for example using additional templates, to assemble more mating parts. For example, in the embodiment of the invention shown in FIG. 4, suitable templates may be utilized to mount a number of gears on shaft 76 to form a transmission or the like.

In addition, while for the embodiment of the invention shown in the figures, pallet 10 has been shown as being at different stations for the loading of different parts, for some embodiments of the invention it is preferable that the loading be sequentially performed at the same station. Thus, a hopper 24 would initially be loaded with the first parts to be assembled which would be passed across the pallet with the vibration table and the pallet thereon being vibrated with a first set of parameters. When a sufficient number of the depressions or other irregularities in the pallet are determined to be mated, either by actually sensing the number of depressions which are full with a suitable sensor or because the vibration operation had been run for a sufficient period for the pallet to normally be full or substantially full, any remaining first parts in the hopper would be removed and the hopper filled with second parts. In the alternative, the hopper utilized could be replaced with a different hopper containing the second parts or multiple hoppers, and possibly multiple chutes, could be provided at the station. Suitable adjustments would then be made in the vibration parameters for the second parts and a template would be lowered on the pallet if required. The pallet would then be vibrated using the new parameters and the second parts dumped thereon (or on the template) to assemble the first parts therewith. This sequence of operation could then be repeated at the same station for one or more additional parts. Either between assembly operations or when all desired parts have been assembled, a pressure plate or other suitable means could be utilized to secure the parts together in the manner previously described. Again, the securing operation could be performed at the same station as the orienting and assembly operations, or a conveyor such as conveyor 12 might be utilized to move the pallet to a different station for the securing operation.

Also, while the direction of movement for parts moving across a pallet may be controlled by controlling the angle of the pallet, with current APOS equipment, such tilting is generally only possible in a single dimension. To the extent it may be desirable to have the parts move in a direction other than the direction dictated by this single slope direction, suitable means may either be provided to slant the pallet in a different direction or the upper face of the pallet or of a template used therewith may have a slope so as to cause the parts to move in a desired direction. Channels or rails such as rails 90 may also be at an angle or otherwise configured to move parts in a desired direction. This may be particularly desirable where, in order to effect a given assembly, it is desired that the parts enter a depression or otherwise mate with an irregularity at a particular angle, rather than dropping straight down. This may also be accomplished by having an entry to the depression at an angle such as the angle entry 116 shown in FIG. 5. Air jets blowing across the pallet or template may also be utilized to control direction of motion. Air jets may also be utilized to clear jams of parts if such jams should form. Another possibility to achieve a desired orientation for a part is to have an irregularity in the part hook on or otherwise mate with a projection or other irregularity on the template or pallet, the part then rotating about the mated irregularity until a desired orientation is achieved.

Similarly, while for the embodiments disclosed, pressure plates have been utilized to secure mated parts together, other suitable means, such as laser or other heating techniques, might be utilized to suitably deform a part to secure two parts together, or the parts may be secured by welding, soldering or other suitable means.

Further, while for most embodiments, parts have fit in a depression in a pallet or other part, the depression could also be in the part, with the part depression mating with a projection or other irregularity on the pallet or earlier-mounted part. More generally, irregularities on the parts or the entire part could mate with corresponding irregularities on the pallet or template. Means other than vibration tables 14, vibration mechanisms 16 and 17 and/or hoppers 24 and chutes 22 could also be utilized for performing the functions of these elements.

Thus, while the invention has been particularly shown and described above with reference to preferred embodiments, the foregoing and other changes in form and detail may be made therein by one skilled in the art without departing from the spirit and scope of the invention.

What is claimed is:

1. A method for automatically assembling a plurality of first parts with a corresponding plurality of second parts comprising the steps of:
   (a) mechanically dumping said first parts from a reservoir of said parts with random orientation on a pallet having irregularities formed therein which are sized and shaped to permit said first parts to mate therewith in a predetermined orientation;
   (b) utilizing a vibrating apparatus to mechanically vibrate said pallet, causing said first parts to mate in a predetermined way with said irregularities;
   (c) mechanically dumping said second parts from a reservoir of said parts with random orientation over said pallet, said pallet having first parts mated with at least most of the irregularities therein, second irregularities being provided to control the orientation and position of the second parts; and
   (d) utilizing a vibrating apparatus to mechanically vibrate the pallet, moving the second parts under control of the second irregularities into a predetermined positional relationship with corresponding first parts.

2. A method as claimed in claim 1 wherein said first and second parts are mating parts, said predetermined positional relationship being mating equipment, at least one of said second irregularities being on said first parts.

3. A method as claimed in claim 2 including the step of
   (e) securing together first and second parts which are in mating engagement.

4. A method as claimed in claim 3 wherein said securing step is performed simultaneously for all first and second parts in mating equipment.

5. A method as claimed in claim 3 wherein mating first and second parts snap-fit together, and including the step of applying pressure to at least one of said first or second parts in mating engagement to snap-fit the parts together.

6. A method as claimed in claim 3 wherein mating first and second parts pressure-fit together, and including the step of applying pressure to at least one of said first or second parts in mating engagement to pressure-fit the parts together.

7. A method as claimed in claim 3 wherein one of said parts is deformable to secure parts together, and including the step of applying pressure to at least one of said first or second parts in mating engagement to deform said one part.

8. A method as claimed in claim 1 wherein said step (c) includes the steps of laying a template over the pallet, which template has openings formed therethrough which are sized and shaped to receive and properly orient the second parts, said template openings being at least one of said second irregularities, and dumping the second parts on said template.

9. A method as claimed in claim 8 wherein the second part is formed to be in the predetermined positional relationship with a corresponding first part in two or more orientations, said template openings being formed to permit said second part to be oriented in only said two or more orientations.

10. A method as claimed in claim 8 wherein the second part is formed to be in the predetermined positional relationship with a corresponding first part in only one orientation, said template openings being formed to permit said second parts to be oriented in only said one orientation.

11. A method as claimed in claim 8 including the step of registering said template on said pallet.

12. A method as claimed in claim 8 including the step of controlling the direction of movement of the second parts across the template.

13. A method as claimed in claim 12 wherein the controlling direction of movement step includes the step of moving second parts in different directions at different positions on the template.

14. A method as claimed in claim 12 including the step of controlling the orientation of the second parts as they are moved across the template.

15. A method as claimed in claim 1 wherein the second part is formed to assemble with a corresponding first part in two or more orientations, at least one of said pallet irregularities and corresponding first parts being formed to permit said second part to be oriented in only said two or more orientations.

16. A method as claimed in claim 1 wherein the second part is formed to assemble with a corresponding first part in only one orientation, at least one of said pallet irregularities and corresponding first parts being formed to permit said second part to be oriented in only said one orientation.

17. A method of automatically forming N assemblies of M parts each comprising the steps of:
(a) mechanically dumping a plurality of first parts from a reservoir of such parts with random orientation on a pallet having irregularities formed therein which are sized and shaped to permit said first parts to mate therewith in a predetermined orientation;
(b) utilizing vibrating apparatus to mechanically vibrate said pallet, causing said first parts to mate in a predetermined way with said irregularities;
(c) mechanically dumping a plurality of an additional one of said M parts from a reservoir is such parts with random orientation over said pallet, additional irregularities being provided to control the orientation and position of said additional parts;
(d) utilizing vibrating apparatus to mechanically vibrate the pallet, moving the additional parts under control of the additional irregularities into a predetermined positional relationship with corresponding prior positioned parts; and
(e) repeating steps (c) and (d) until all M parts have been assembled.

* * * * *